United States Patent [19]
Blasingame et al.

[11] Patent Number: 5,885,902
[45] Date of Patent: *Mar. 23, 1999

[54] INTEGRATED ARC AND POLYSILICON ETCHING PROCESS

[75] Inventors: Tom Blasingame, Austin, Tex.; Subash Gupta; Scott A. Bell, both of San Jose, Calif.

[73] Assignee: Advanced Micro Devices, Inc., Sunnyvale, Calif.

[ * ] Notice: The term of this patent shall not extend beyond the expiration date of Pat. No. 5,763,327.

[21] Appl. No.: 964,855

[22] Filed: Nov. 5, 1997

Related U.S. Application Data

[63] Continuation of Ser. No. 554,413, Nov. 8, 1995, Pat. No. 5,763,327.

[51] Int. Cl.⁶ .................................................. H01L 21/00
[52] U.S. Cl. ...................... 438/738; 438/719; 438/725; 438/742; 438/952
[58] Field of Search ............................. 438/719, 725, 438/738, 742, 952

[56] References Cited

U.S. PATENT DOCUMENTS

| | | | |
|---|---|---|---|
| 5,066,615 | 11/1991 | Brady et al. | 437/221 |
| 5,106,786 | 4/1992 | Brady et al. | 437/229 |
| 5,286,608 | 2/1994 | Koh | 430/313 |
| 5,314,576 | 5/1994 | Kadomura | 156/655 |
| 5,368,686 | 11/1994 | Tatsumi et al. | 156/656 |
| 5,378,311 | 1/1995 | Nagayama et al. | 156/643 |
| 5,401,614 | 3/1995 | Dichiara et al. | 430/323 |
| 5,494,840 | 2/1996 | Ohmi | 427/52 |
| 5,514,880 | 5/1996 | Nishimura et al. | 257/70 |
| 5,545,289 | 8/1996 | Chen et al. | 156/643.1 |
| 5,545,588 | 8/1996 | Yoo | 437/187 |
| 5,580,701 | 12/1996 | Lur et al. | 430/316 |
| 5,635,335 | 6/1997 | Bae et al. | 430/312 |
| 5,646,870 | 7/1997 | Krivokapic et al. | 364/578 |

FOREIGN PATENT DOCUMENTS

| | | | |
|---|---|---|---|
| A-0123813 | 7/1984 | European Pat. Off. | H01L 21/31 |
| A-0573212 | 8/1993 | European Pat. Off. | H01L 21/27 |
| 1052142 | 2/1989 | Japan | G03C 5/00 |
| WO 94/12912 | 9/1994 | WIPO | G03F 7/09 |

*Primary Examiner*—Nam Nguyen
*Assistant Examiner*—Steven H. Ver Sterg
*Attorney, Agent, or Firm*—McDermott, Will & Emery

[57] ABSTRACT

A composite of an anti-reflective coating on polysilicon is accurately etched to form a polysilicon pattern by initially etching the ARC with gaseous plasma containing helium and/or nitrogen which is substantially inert with respect to polysilicon.

10 Claims, 1 Drawing Sheet

INTEGRATED ARC AND POLYSILICON ETCHING PROCESS

This application is a continuation of application Ser. No. 08/554,413 filed Nov. 8, 1995 now U.S. Pat. No. 5,763,327.

TECHNICAL FIELD

The present invention relates to a method of manufacturing a semiconductor device wherein a composite of an anti-reflection coating and a polysilicon layer is etched to form a polysilicon pattern. The invention has particular application in the manufacture of semiconductor devices having sub-half micron circuitry.

BACKGROUND ART

The escalating requirements for high density and performance associated with ultra-large scale integration require responsive changes in conductive patterns, which is considered one of the most demanding aspects of ultra-large scale integration technology. High density demands for ultra-large scale integration semiconductor wiring require increasingly denser arrays with minimal spacing between conductive lines. This problem is exacerbated in manufacturing semiconductor devices having sub-half micron technology.

In accordance with conventional practices, an anti-reflective coating (ARC) is utilized in sub-half micron photolithography to minimize notches caused by reflections. In accordance with such conventional practices, design features of about 0.35 microns are printed using i-line lithographic techniques. Typically, an i-line photoresist is applied on a polysilicon layer, with an organic ARC disposed therebetween. This type of arrangement is routinely utilized in the manufacture of semiconductor devices, particularly for forming a gate electrode, wherein the gate electrode image is transferred to the polysilicon layer employing an anisotropic plasma etching technique. Thus, in order to pattern the polysilicon layer into a gate electrode, the ARC must be etched prior to etching the polysilicon layer to form the gate electrode.

Conventional practices involve the use of etching recipes based on fluorinated hydrocarbons, such as $CF_4/O_2$ and $CHF_3/O_2/Ar$ to etch the ARC. After etching the ARC, the polysilicon layer is conventionally etched employing a recipe such as $Cl_2/Br_2$ with or without $BCl_3$. Both the ARC and polysilicon layers are etched in a gaseous plasma.

It is extremely difficult, if not impossible, to etch a composite comprising of a polysilicon underlayer and an ARC thereon in a single chamber. In addition, the etch profiles of gate electrodes formed on a semiconductor substrate lack uniformity, notwithstanding their formation during the same etching procedure.

Accordingly, there exists a need for a method of manufacturing a semiconductor device wherein a composite of a polysilicon underlayer and an ARC thereon is etched in a single chamber to accurately pattern gate electrodes exhibiting uniform etch profiles.

DISCLOSURE OF THE INVENTION

An object of the present invention is a method of manufacturing a semiconductor device by accurately etching a composite comprising an ARC on a polysilicon layer to form a polysilicon pattern in a single chamber.

Another object of the present invention is a method of manufacturing a semiconductor device by etching a composite comprising an ARC on a polysilicon layer to form polysilicon gate electrodes having uniform etch profiles.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device, which method comprises: depositing a layer of polysilicon; depositing a dielectric anti-reflective coating on the polysilicon layer; etching the dielectric coating anti-reflective with a first etchant comprising an inert gaseous plasma containing helium, nitrogen or a mixture thereof, which does not substantially etch the polysilicon layer; and etching the polysilicon layer with a second etchant to form a pattern.

Another aspect of the present invention is a method of manufacturing a semiconductor device, which method comprises: depositing a polysilicon layer on a dielectric layer; depositing a dielectric anti-reflective coating on the polysilicon layer by a spin-on technique; forming a resist pattern on the dielectric anti-reflective coating; etching the dielectric anti-reflective coating with a first etchant comprising an inert gaseous plasma containing helium, nitrogen or a mixture thereof, which does not substantially etch the polysilicon layer; and etching the polysilicon layer with a second etchant to form a conductive pattern.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

DESCRIPTION OF THE INVENTION

Figure 1:
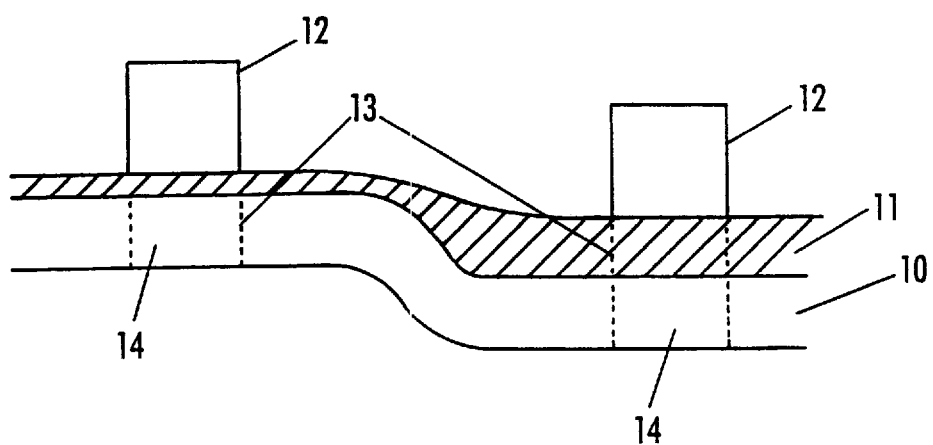
FIG. 1 schematically depicts a composite to be etched in accordance with the present invention.

In order to address the difficulty of accurately etching a composite comprising a polysilicon underlayer and an ARC thereon in a single chamber with consistent etch profiles, it was first necessary to gain an understanding of the causes of such problems. Upon investigation, it was found that strong interactions involving the etching chemistries for the ARC and the polysilicon layer undesirably occur, rendering it virtually impossible to pattern the polysilicon layer with an ARC thereon in a single chamber. It was also found that variations in the thickness of the ARC due to the non-planar surface topography of the polysilicon layer is typical. For example, as shown in FIG. 1, polysilicon layer 10 having a non-planar surface topography is coated with a conventional ARC, such as a conventional organic or organometallic material typically applied by a spin-on technique. Due to the non-planar surface topography of the polysilicon layer, the ARC exhibits a non-uniform thickness. A photoresist mask pattern 12 is then applied to the ARC. Dotted lines 13 circumscribe remaining portions of the composite after etching, and reference numeral 14 indicates the resulting polysilicon pattern, such as a gate electrode.

The non-uniform thickness of the ARC poses a perplexing problem during etching. The thinner portion of the ARC is removed on the high portions of the irregular polysilicon surface, thereby exposing the polysilicon layer to the ARC etching recipe during continued etching of the thicker portions of the ARC in the low lying areas. Thus, both the ARC and portions of the polysilicon layer are simultaneously exposed to the ARC etchant, typically a freon containing plasma, during which fluorinated species begin to etch the exposed polysilicon area. The resulting polysilicon pattern exhibits an undesirable variation in etch profiles between the polysilicon in the high areas vis-à-vis the polysilicon in the low areas, by virtue of the exposure to two different plasma etching environments.

An additional problem encountered during etching a stack comprising an ARC on a polysilicon layer is the inability to accurately detect the etch endpoint for etching the ARC. Conventional ARC etching recipes typically result in the formation of a polymeric type coating on the polysilicon layer and on the chamber, including the optical window of an optical emission spectrometer. As a result of a drift in the endpoint traces leads to misprocessing of material. Post ARC etch in situ cleaning with multiple low power $N_2/O_2$ flashes are minimally effective, and exact a significant toll on wafer throughput.

The present invention solves the problems attendant upon conventional techniques for etching a composite comprising an ARC on a polysilicon layer, as in forming gate electrodes of transistors. In a typical situation, as shown in FIG. 1, the polysilicon layer 10, is deposited on a dielectric layer (not shown) which, in turn, is usually formed on a semiconductor substrate (not shown). The surface topography of the polysilicon layer is typically non-uniform, i.e., non-planar. Accordingly, ARC 11, which is normally applied by a spin-on technique, exhibits a non-uniform thickness. As a result of the non-uniform thickness, the polysilicon under the thinner portion of the ARC is exposed to the ARC plasma etchant before the thicker portion of the ARC is removed. Consequentially, the resulting polysilicon patterns 14 exhibit variations in their etch profiles by virtue of exposure to different plasma etching recipes. The interactions between the two etching chemistries also renders it virtually impossible to conduct etching in a single chamber. The endpoint detection is also quite difficult due to polymeric type depositions during ARC etching.

The present invention overcomes these problems attendant upon conventional practices for etching a composite comprising an ARC on a polysilicon layer by employing, as the first etchant to etch the ARC, a gaseous plasma which etches the ARC but is substantially inert with respect to the polysilicon layer and, hence, does not substantially etch the polysilicon layer. Thus, in accordance with the present invention, ARC 11 is etched using a gaseous plasma comprising helium and/or nitrogen, preferably nitrogen or a mixture of nitrogen and helium. An additional inert gas, such as argon or neon, can also be included in the gaseous plasma.

In copending application Ser. No. 08/359,232 filed on Dec. 19, 1994 now abandoned, a method is disclosed for etching a composite comprising a photoresist on an ARC using an inert gaseous nitrogen plasma to maintain the resist profiles during removal of the spin-on ARC layer. Thus, the selectivity of the ARC layer is increased vis-à-vis the photoresist.

In accordance with the present invention, an inert gaseous plasma, preferably of nitrogen, is employed to etch an ARC without any substantial etching of any exposed underlying polysilicon. In conducting the present invention, one having ordinary skill in the art can easily optimize the process conditions, such as the flow rate and pressure to achieve the stated objective. For example, it has been found that a pressure of about 10 m Torr to about 100 m Torr has been found suitable using a gaseous plasma of nitrogen and helium.

Since the gaseous plasma employed to etch the ARC is substantially non-reactive with respect to the polysilicon layer, no substantial polysilicon etching occurs after any thin portions of the ARC have been etched and while thicker portions of the ARC are undergoing etching. After removal of the entire ARC, the polysilicon layer is etched using a conventional polysilicon etchant, to form a polysilicon pattern with substantially similar etch profiles regardless of whether the polysilicon pattern is formed under thin or thick portions of the ARC.

In carrying out the present invention, conventional materials and processing techniques are employed and, hence, are not set forth herein in detail. In accordance with the present invention, the first etchant employed to remove the ARC is non-reactive with respect to the polysilicon, but effectively removes the ARC. Such etchants can comprise, for example, helium and/or nitrogen, preferably nitrogen or a mixture of nitrogen and helium. An additional inert gas, such as argon or neon, can also be added. The flow rate amounts of nitrogen and helium can be easily optimized for a particular situation, as can the appropriate process parameters for a particular situation. It has been found that a pressure of 10 m Torr to about 100 m Torr is effective to remove a silicon oxynitride ARC with a gaseous plasma containing nitrogen and helium.

The second etchant employed to the etch polysilicon underlayer can be any etchant conventionally employed to etch polysilicon. For example, a gaseous plasma comprising a halogen with or without a minor amount of oxygen can be employed. It has been found that a gaseous plasma comprising $Cl_2$, $Br_2$ or HBr, He and $O_2$ is suitable as the second etchant. The amounts of He and $O_2$ can be optimized in accordance with conventional practices to achieve a desired selectivity.

As in conventional practices, the ARC typically comprises a material capable of being dispensed by a spin-on technique. Such conventional spin-on ARC materials typically comprise organic or organometallic materials and are commercially available, such as BARLi from Hoescht Celanese. Commercially available ARC materials are also available from Shipley and Brewer Science. Typically, the ARC is deposited at a thickness up to about 1100 Å.

In accordance with the present invention, a non-reactive gaseous plasm etching recipe, such as nitrogen, helium, or a mixture thereof, is employed to etch an ARC comprising an organic or organometallic material applied by a spin-on technique. The inert gaseous plasma does not attack the underlying polysilicon layer when exposed in the high portions of the surface topography under thin portions of the ARC, while lower areas under thick portions of the ARC undergo etching. Another advantage of the present invention resides in the reconditioning of the chamber during the ARC etch, i.e, removal of the deposited polymeric material by the inert gaseous plasma. Therefore, etch endpoint detection is improved and both the ARC and polysilicon layer can be etched in a single chamber, without the need for an intermediate cleaning step to remove polymeric material from the polysilicon layer and/or the chamber.

The present invention is applicable to various phases of semiconductor manufacturing wherein a polysilicon layer is etched to form a pattern, particularly a pattern having sub-half micron geometry using an anti-reflective coating. Such patterns comprise, for example, the formation of a gate electrode of a transistor.

Only the preferred embodiment of the invention and an example of its versatility is shown and described in the present disclosure. It is to be understood that the invention is capable of use in various other combinations and environments and is capable of changes or modifications within the scope of the inventive concept as expressed herein.

We claim:

1. A method of manufacturing a semiconductor device, which method comprises:

depositing a layer of polysilicon on a dielectric layer;

depositing a dielectric anti-reflective coating on the polysilicon layer;

etching the dielectric anti-reflective coating with a first etchant comprising an inert gaseous plasma containing either helium, nitrogen, or a mixture thereof, which does not substantially etch the polysilicon layer; and etching the polysilicon layer with a second etchant to form a pattern.

2. The method according to claim 1, wherein the polysilicon layer has a non-planar surface topography and the dielectric anti-reflective coating has a resulting non-uniform thickness due to the non-planar surface topography of the polysilicon layer.

3. The method according to claim 2, comprising etching the polysilicon layer with a second etchant to form a conductive pattern comprising a plurality of gate electrodes having substantially similar etch profiles.

4. The method according to claim 1, wherein the dielectric anti-reflective coating and the polysilicon layer are etched in the same chamber.

5. The method according to claim 4, wherein the dielectric anti-reflective coating and polysilicon layers are sequentially etched without conducting an intervening step to remove polymeric material from the polysilicon layer and/or the chamber.

6. The method according to claim 1, wherein the first etchant comprises a gaseous plasma containing nitrogen with or without an inert gas.

7. The method according to claim 1, wherein the dielectric anti-reflective coating comprises an organic or organometallic material.

8. The method according to claim 1, comprising etching the polysilicon layer with a second etchant to form a pattern comprising a gate electrode.

9. The method according to claim 8, wherein the gate electrode has a substantially uniform etch profile.

10. The method according to claim 1, comprising etching the polysilicon layer with a second etchant to form a conductive pattern comprising a plurality of gate electrodes having substantially similar etch profiles.

* * * * *